US005489192A

United States Patent [19]
Taniguchi

[11] Patent Number: 5,489,192
[45] Date of Patent: Feb. 6, 1996

[54] HEAT RESISTING ROBOT HAND APPARATUS

[75] Inventor: Takao Taniguchi, Fukuoka, Japan

[73] Assignee: Mitsubishi Denki Kabushiki Kaisha, Tokyo, Japan

[21] Appl. No.: 172,096

[22] Filed: Dec. 23, 1993

[30] Foreign Application Priority Data

Dec. 28, 1992 [JP] Japan ................... 4-349330

[51] Int. Cl.$^6$ .................................. B25J 19/00
[52] U.S. Cl. ............. 414/744.2; 118/500; 294/86.4; 294/131; 414/935; 901/30
[58] Field of Search .............. 414/744.2–744.5, 414/935, 939; 901/30, 39; 118/724, 200; 204/298.09; 294/131, 86.4, 64.1

[56] References Cited

U.S. PATENT DOCUMENTS

| | | | |
|---|---|---|---|
| 3,530,930 | 9/1970 | Oldfield | 204/298.09 |
| 4,517,070 | 5/1985 | Kisner | 204/298.09 |
| 4,647,266 | 3/1987 | Coad | 414/939 X |
| 5,030,056 | 7/1991 | Kitayama et al. | 414/222 X |
| 5,080,549 | 1/1992 | Goodwin et al. | 414/939 X |
| 5,154,464 | 10/1992 | Eichman | 294/131 X |

FOREIGN PATENT DOCUMENTS

| | | |
|---|---|---|
| 3714045 | 11/1987 | Germany. |
| 5-74699 | 3/1993 | Japan ................... 414/941 |
| 2193482 | 2/1988 | United Kingdom. |

*Primary Examiner*—Donald W. Underwood
*Attorney, Agent, or Firm*—Leydig, Voit & Mayer

[57] ABSTRACT

A heat resisting robot hand apparatus suitable for use within a highly-heated and pressure-reduced chamber in which radiant heat emitted from a heat stage and a material to be heated, such as a semiconductor wafer, is reflected and intercepted, and in which the heat from the material conducted to an arm section is reduced. The heat resisting robot hand apparatus includes a hand section supporting a material to be heated and a heat reflection plate reflecting radiant heat, parallel and adjacent to the portion of the hand section for supporting the material with an intervening gap. The heat reflection plate is supported on the hand section by heat-insulating supports with a gap for accommodating heat distortion. The hand section is connected to the arm section by heat-insulating fitting means with a heat-insulation space. Seats of the hand section contact the material independent of the hand section. Further, the heat reflection plate is cooled by cooling structure.

20 Claims, 4 Drawing Sheets

HEAT RESISTING ROBOT HAND APPARATUS

BACKGROUND OF THE INVENTION

The present invention relates to a heat resisting robot hand apparatus for placing into and removing from a chamber a material to be heated, such as a semiconductor wafer, the chamber having a high temperature and a reduced pressure for manufacturing semiconductor devices and the like.

FIG. 8 shows, in cross section, a conventional robot hand for placing into and removing from a chamber a material such as a semiconductor wafer to be heated in a chamber which contains therein a heater for heating the material to a high temperature so as to dry it. In this figure, a box-shaped chamber 1 contains therein a heat stage 5 suspended from the ceiling of the chamber I for-heating a semiconductor wafer 3, and a hanger 7 comprising a plurality of L-shaped rods for vertically supporting a semiconductor wafer 3. The chamber 1 is provided at one side with a gate 9 through which the semiconductor wafer 3 can be inserted into the chamber 1 under the action of the robot hand, which is generally denoted at reference numeral 11. The robot hand 11 comprises a hand section 13 formed of a generally quadrilateral flat plate for supporting thereon the semiconductor wafer 3, and an arm section 17 fixedly connected to one end of the hand section 13 via screws 15. Though not illustrated, a pressure reducing means such as a vacuum pump is connected to the chamber 1 for reducing the pressure in the chamber 1 to an appropriate level.

The operation of the robot hand 11 illustrated in FIG. 8 will now be explained below. The arm section 17 is first caused by an unillustrated arm driving means to contract and pull the hand section 13 out of the chamber 1. In this state, the semiconductor wafer 3 is then placed on the hand section 13, and the arm section 17 is caused by the unillustrated arm driving means to extend or move into the chamber 1 so as to insert the semiconductor wafer 3 into the chamber 1. Before the hand section 13 has been inserted into the chamber 1, the top end of the hanger 7 is caused by an unillustrated drive mechanism to descend to a location lower than the hand section 13. When the hand section 13 and the wafer 3 has been inserted into a predetermined position of the chamber 1, the hanger 7 is raised to such an extent that the top surface of the wafer 3 abuts against the bottom surface of the heat stage 5 while claws 7a at the bottom end of the hanger 7 are holding the wafer 3. Subsequently, the heat stage 5 is powered by an unillustrated power source to heat and dry the wafer 3. After the wafer 3 has been sufficiently dried, the hanger 7 is lowered so that the wafer 3 is transferred to the hand section 13 which has been waiting at a location below the heat stage 5. At this time, the hanger 7 is descended to a location slightly lower than the hand section 13, and thus, the wafer 3 is totally released from the hanger 7 and supported by the hand section 13 alone. The arm section 17 is moved to the outside of the chamber 1, and accordingly, the hand section 13 together with the wafer 3 is pulled out of the chamber 1 through the gate 9. Subsequently, the thus dried wafer 3 is removed from the hand section 13 and transferred to a next stage for the following processing. A new undried wafer 3 is placed on the hand section 13, and a series of operations described above are repeated.

However, the foregoing conventional robot hand presents the following problems. While the wafer 3 is supported by the hanger 7 and it is heated and dried by the heat stage 5, the robot hand 11 is vulnerable to radiant heat from the heat stage 5 and the wafer 3. Also, while the heated wafer 3 is on the hand section 13, the heat emitted from the wafer 3 is directly transferred to the hand section 13 through the area of contact between the wafer 3 and the hand section 13. Thus, the robot hand 11 is exposed to thermal deterioration and distortion during a long period of use, thereby changing the position of transferring the wafer 3 between the hand section 13 and the hanger 7, and thus failing to correctly transfer the wafer 3 therebetween. A crack may also occur in the robot hand 11, in particular, in the hand section 13 due to the thermal stress. Further, the heat emitted from the hand section 13 is transferred to the arm section 17 so that a drive controlling section (not shown) arranged on the arm section 17 is thermally deteriorated.

SUMMARY OF THE INVENTION

Accordingly, in order to overcome the above drawbacks, an object of the present invention is to provide a heat resisting robot hand apparatus suitable for a long period of use within the highly-heated chamber in which adverse influences of radiant heat emitted from a material to be heated, such as a semiconductor wafer, and a heat stage can be avoided as much as possible, and in which the heat conduction from the material can be inhibited, thus avoiding heat distortion and deformation and further maintaining the positional precision of the hand section as much as possible.

In order to achieve the above objects, the present invention provides a heat resisting robot hand apparatus comprising: a hand section for supporting a material to be heated; and a heat reflection plate reflecting radiant heat, the plate being disposed parallel and adjacent to the portion of the hand section for supporting the material with an intervening gap.

As constructed above, when the highly-heated and dried material is supported by the hand section, radiant heat emitted from the material at a high temperature is reflected and intercepted by the heat reflection plate, thereby remarkably decreasing the radiant heat transferred to the hand section.

In a preferred form of the heat resisting robot hand apparatus according to the present invention, the heat reflection plate may be supported by the hand section via heat-insulating support means with a gap accommodating thermal distortion of the heat to reflection plate. The gap formed in the connecting portion between the heat reflection plate and the hand section accommodates the heat distortion and deformation of the heat reflection plate, thereby effectively inhibiting adverse influences on the hand section.

In another preferred form of the heat resisting robot hand apparatus according to the present invention, the hand section may be connected to an arm section by heat-insulation fitting means with a heat-insulation space formed therebetween. Thus, the heat transmitted to the arm section from the hand section can be remarkably reduced by the heat-insulation space, thereby further decreasing the thermal distortion and deformation of the arm section.

In a further preferred form of the heat resisting robot hand apparatus according to the present invention, seats of the hand section, which contact and support the material, may be formed separately from or independent of the hand section. Thus, even though the heat is conducted to the hand section from the highly-heated material via the seats, the heat distortion of the seats is not directly transferred to the hand section because the seats are formed separately from the hand section. Therefore, only the heat distortion of the hand section has to be considered. Even though the seats and the hand section are formed of different materials, thermal stress between the two components caused by the disparity in heat distortion thereof is not generated.

In still another preferred form of the present invention, a heat resisting robot hand apparatus is provided with cooling means for cooling the heat reflection plate. Since the heat reflection plate is cooled by the cooling means, the effect of reflecting and intercepting radiant heat emitted from the material by the heat reflection plate can be improved.

The above and other objects, features and advantages of the present invention will be more readily apparent from the following detailed description of preferred embodiments of the invention taken in conjunction with the accompanying drawings.

DESCRIPTION OF THE PREFERRED EMBODIMENTS

Preferred embodiments of the present invention will be hereinafter described with reference to the accompanying drawings.

Figure 1:
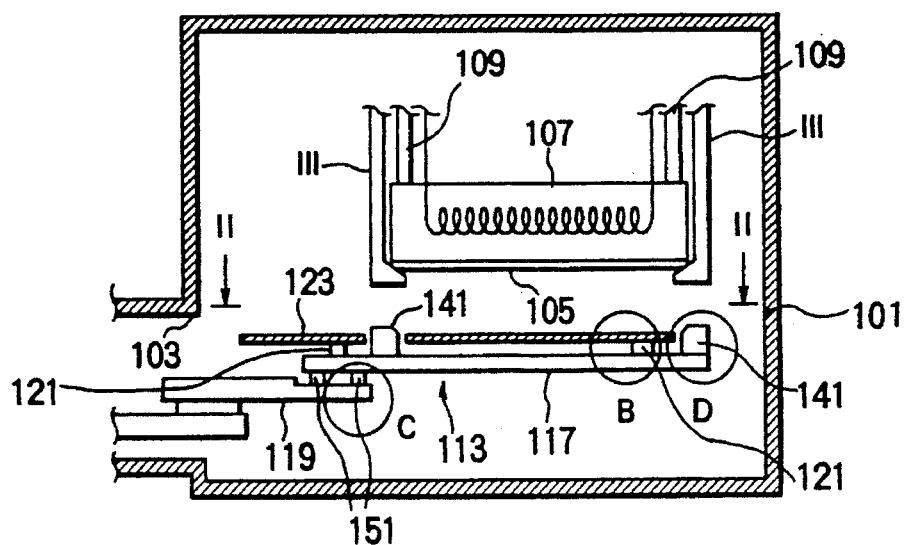
FIG. 1 is a front sectional view of a chamber with a heat resisting robot hand apparatus constructed in accordance with a first embodiment of the present invention.

Referring first to FIG. 1 which shows a heat resisting robot hand apparatus constructed in accordance with a first embodiment of the present invention, a box-shaped chamber 101 with a gate 103 formed on one side thereof contains therein a heat stage 107 suspended from the ceiling of the chamber 101 via supporting members 109 in order to heat a material 105 such as a semiconductor wafer and the like, and a hanger 111 comprising a plurality of L-shaped rods for vertically moving the material 105 to be heated between a robot hand 113, which will be described later in detail, and the heat stage 107. In this embodiment, the material 105 is a generally circular semiconductor wafer. The robot hand 113 is arranged below the heat stage 107 so as to place into and take out of the chamber 101 the material 105 by way of the gate 103.

Figure 2:
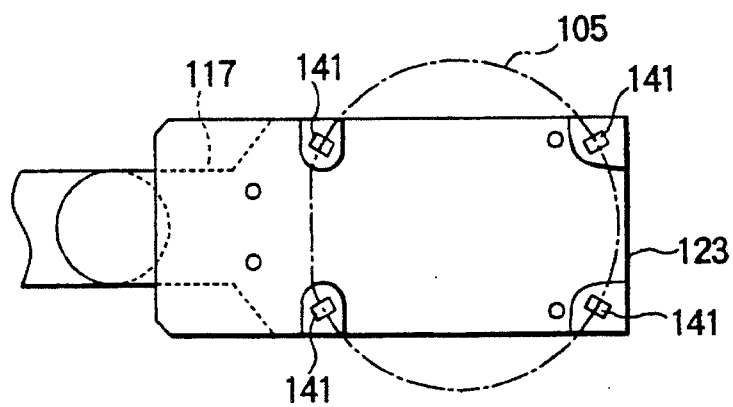
FIG. 2 is a sectional view taken on line II—II of FIG. 1.

As shown in FIGS. 1 and 2, the robot hand 113 comprises a hand section 117 for supporting the material 105 to be heated via heat insulating seats 141 to be described later, an arm section 119 fixedly connected at one end to the hand section 117 for placing into and removing from the chamber 101 the hand section 117 via the gate 103, and a heat reflection plate 123 disposed above and supported by the hand section 117 via heat insulation supporting means 121. As shown in FIG. 1, the heat reflection plate 123 is spaced from the hand section 117 by an air gap.

Figure 3:
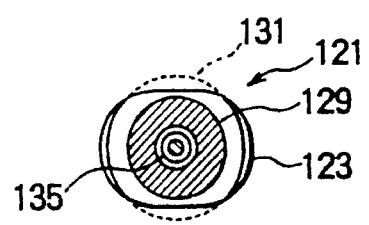
FIG. 3 is a cross section taken on line III—III of FIG. 4.
Figure 4:
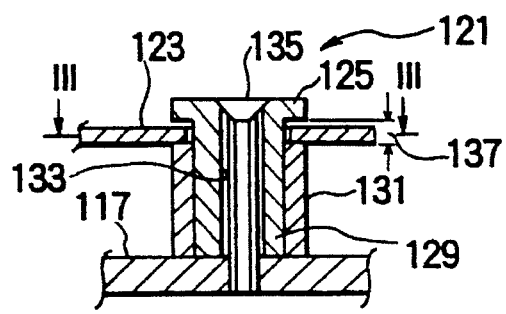
FIG. 4 is an enlarged vertical sectional view of an encircled portion B of FIG. 1.

As illustrated in FIGS. 3 and 4, the heat-insulating support means 121 for heat-insulatingly supporting the heat reflection plate 123 on the hand section 117 comprises: a inner heat-insulating collar 129 in the form of a short cylinder having a head 125 of an enlarged diameter and an axial hole 127 axially extending through the center portion of the heat insulation supporting means 121; an outer heat-insulating collar 131 fitted around the inner heat-insulating collar 129 and being shorter in axial length than the inner heat-insulating collar 129; and a screw 135 passing through an axial hole 133 in the inner heat-insulating collar 129 and threaded into the hand section 117 so as to secure the inner heat-insulating collar 129 to the hand section 117. When the inner and outer heat-insulating collars 129 and 131 are firmly secured to the hand section 117 via the screw 135, a gap 137 having a size or length greater than the thickness of the heat reflection plate 123 is formed between the top of the outer heat-insulating collar 131 and the enlarged-diameter head 125 of the inner heat-insulating collar 129. The hand section 117 is placed in the gap 137 so as to be clamped or held between the enlarged-diameter head 125 of the inner heat insulating collar 129 and the top edge of the outer heat-insulating collar 131. The diameter of the axial hole 133 in the inner heat-insulating collar 129 is greater than the outer diameter of the shaft portion of the screw 135 passing through the axial hole 127 and smaller than the head of the screw 135. Thus, the screw 135 is fitted into the inner heat-insulating collar 129 with some play.

Figure 6:
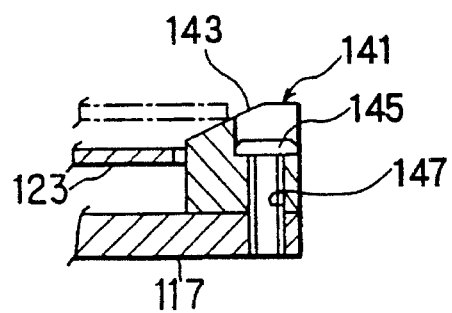
FIG. 6 is an enlarged vertical sectional view of an encircled portion D of FIG. 1.

As shown in FIG. 6, a plurality of (four in this embodiment) seats 141 for supporting the material 105 to be heated, such as a semiconductor wafer, are disposed at four corners of the top surface of the hand section 117 in order to stably support the circular material 105. The seats 141 are each formed of a highly heat-resisting material such as a ceramic. Supporting surfaces 143 tilting toward the center of the hand section 117 are formed atop the seats 141, thereby abutting against the peripheral edge portions of the circular material 105 and stably supporting the material 105 with the smallest area of contact. The seats 141 are secured to the hand section 117 by means of fitting screws 145. The diameter of the holes 147 in the seats 141 for receiving the screws 145 is larger than the outer diameter of the shaft portions of the fitting screws 145 in order to accommodate thermal deformations of the fitting screws 145 and the seats 141 due to the heat.

Figure 5:
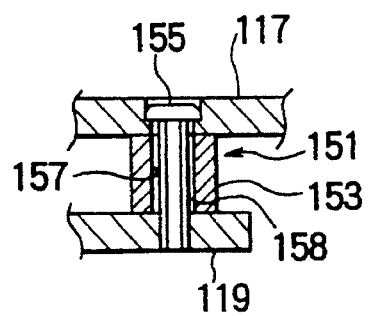
FIG. 5 is an enlarged vertical sectional view of an encircled portion C of FIG. 1.

Further, as illustrated in FIG. 5, the hand section 117 is secured to the arm section 119 by heat-insulation fitting means 151. More specifically, the hand section 117 is secured to the top of the arm section 119 by fastening means 155 such as screws with short cylindrical heat-insulating collars 153 being interposed therebetween, the collars 153 and screws 155 being formed of a material having a limited heat conductivity. The diameter of the axial hole 157 formed in the heat-insulating collar 153 is also made larger than the outer diameter of the shaft portion of the screw 155 in order to accommodate the thermal deformations of the hand section 117, the arm section 119 and the screw 155 due to the heat, and to decrease the heat conduction from the hand section 117 to the arm section 119, thereby forming a circular heat-insulation space 158 between the inner peripheral surface of the axial hole 157 and the outer peripheral surface of the screw 155.

Figure 8:
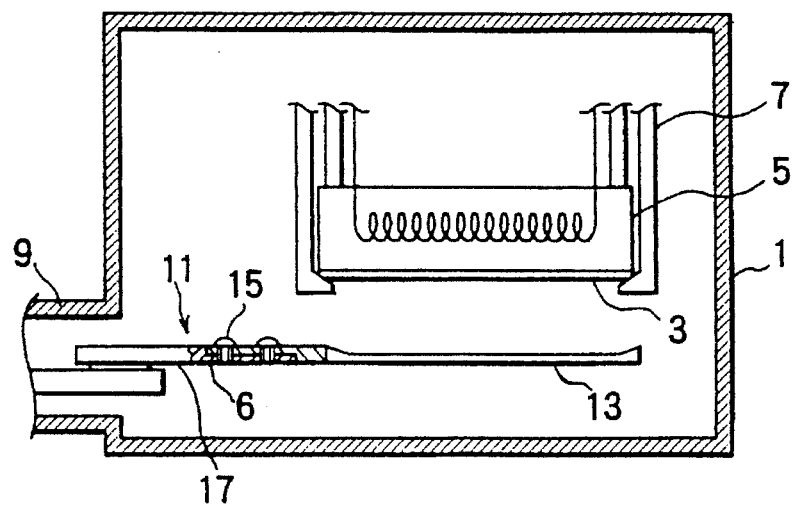
FIG. 8 is a vertical sectional view similar to FIG. 1, but showing an example of a conventional robot hand disposed in a chamber.

The operation of the above embodiment will now be described. In this embodiment, the material 105 to be heated is placed into and removed from the chamber 101 through the gate 103 in the same manner as in the conventional chamber shown in FIG. 8. However, the radiant heat emitted from the heat stage 107 and the material 105 to be heated is intercepted by the heat reflection plate 123 so that it does not directly reach the hand section 117 and the arm section 119. Although the heat reflection plate 123 can be thermally distorted or deformed by heat due to a rise in the temperature, it is fitted around the outer periphery of the inner heat-insulating collar 129 with some radial play, and it is also clamped between the top of the outer heat-insulating collar 131 and the head 125 of the inner heat-insulating collar 129 with the intervening axial gap 137 formed therebetween, so that the thermal distortion or deformation of the heat reflection plate 123 can be accommodated through the radial play or gap and the axial gap 137, thus avoiding adverse influences on the hand section 117. Moreover, only the radiant heat and the conducted heat passing through the heat-insulating support means 121 are transferred from the heat reflection plate 123 to the hand section 117, thus remarkably decreasing the rate of increase of the temperature of the hand section 117 as compared with that of the conventional robot hand shown in FIG. 8.

Further, heat is transferred from the hand section 117 to the arm section 119 only through heat radiation and through heat conduction via the heat-insulating collars 153 and the heat-insulating screws 155, so the heat transferred to the arm section 119 is limited to an extremely small degree.

The seats 141 are brought into direct contact with the material 105 being heated at a high temperature. Since the material 105 is brought into contact at only the edge portions with the tilted or tapered supporting surfaces 143 of the seats 141, the area of contact between the material 105 and the seats 141 is extremely small. Moreover, the seats 141 are formed of a low heat-conductivity and good heat-resisting material to substantially reduce the amount of heat transferred to the hand section 117, so structural deterioration of the seats 141 caused by the heat transmission can be avoided. Further, since the seats 141 can be formed independently of the hand section 117 as different materials and secured to the hand section 117 by the fitting screws 145, the disparity in the heat distortion of the seats 141 and the hand section 117 due to the two different materials employed can be ignored, thereby effectively avoiding any thermal stress which may otherwise be caused by such a disparity.

Figure 7:
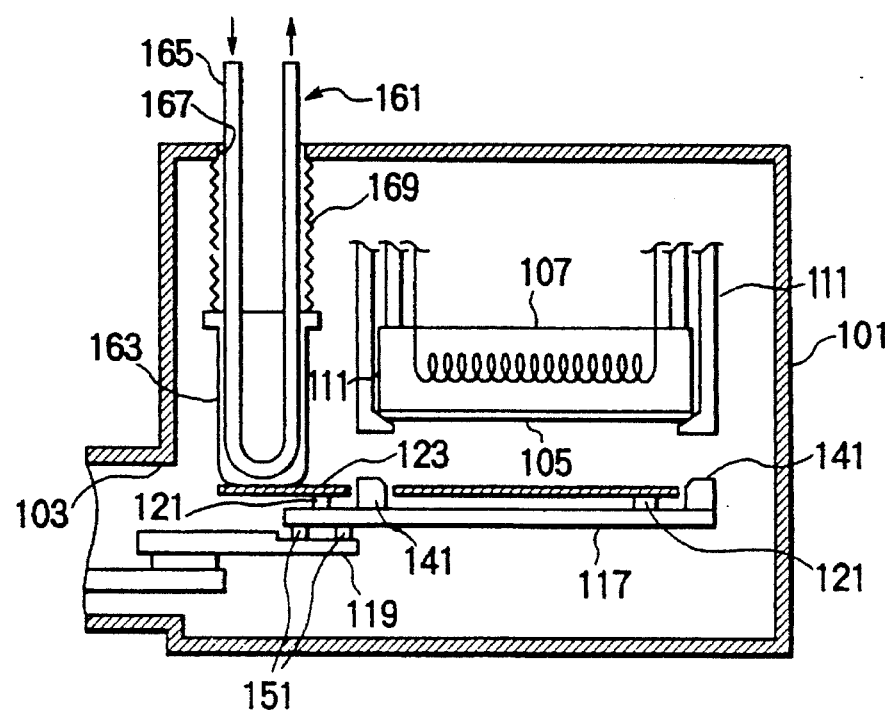
FIG. 7 is a vertical sectional view similar to FIG. 1, but showing a second embodiment of the present invention.

A second embodiment of the present invention is shown in FIG. 7. The construction and the operation of this embodiment are similar to those in the first embodiment, except that cooling means 161 for efficiently cooling the heat reflection plate 123 are added. Components of this embodiment corresponding to those of the aforementioned first embodiment are identified by the same reference numerals as employed in the first embodiment.

More specifically, the cooling means 161 is constructed as follows. A hollow cooling block 163 is disposed at one side of the heat reflection plate 123, and it has an open top end and a closed bottom end contacting the top surface of the heat reflection plate 123. A U-shaped cooling tube 165 is further placed within the cooling block 163. The top end of the cooling tube 165 passes through the top surface of the cooling block 163 and an opening 167 in the top wall of the chamber 101 so as to be connected to a cooling water supplying source (not shown) disposed outside of the chamber 101. The cooling block 163 is connected at the top end thereof to the bottom end of a expandable and contractible bellows 169 which is connected at the top end thereof to the opening 167 in the top wall of the chamber 101. The bellows 169 prevents loss of the vacuum within the chamber 101 from the opening 167 to the outside and also supports the cooling block 163 which is elastically suspended from the top of the chamber 101 through the bellows 169.

When the material 105 is heated, cooling water is circulated through the cooling tube 165, thereby cooling the heat reflection plate 123 via the cooling block 163 with extreme efficiency. Thus, the foregoing inconveniences caused by the heating of the heat reflection plate 123 can be avoided efficiently.

Figure 9:
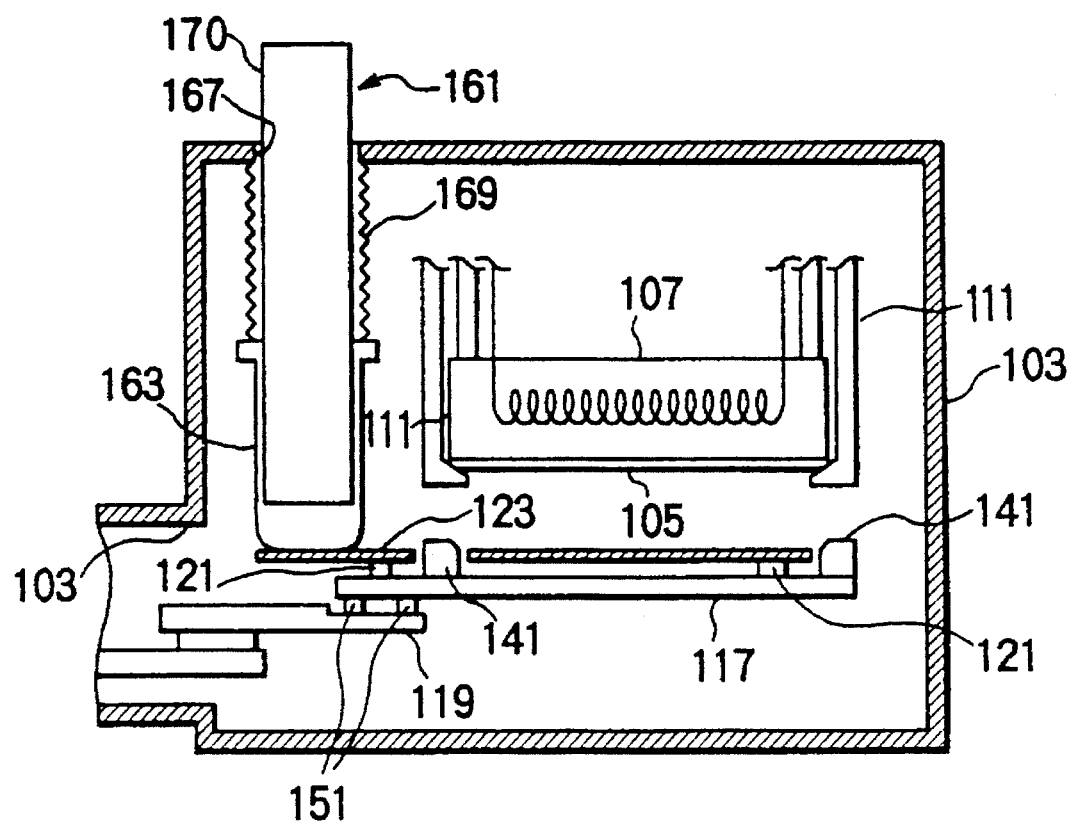
FIG. 9 is a vertical section view similar to FIG. 1, but showing another embodiment of the present invention.

For the purpose of cooling the heat reflection plate 123, instead of using the cooling tube 165 connected to the cooling water supplying source, a heat conductive member 170 formed of a good heat-conductive material, such as copper, may be connected at one end thereof to the cooling block 163 and exposed at the other end thereof to the outside, as shown in FIG. 9. Thus, the heat of the heat reflection plate 123 may be naturally discharged to the outside of the chamber 101 via the heat conductive member.

As will be clearly understood from the foregoing description, the present invention offers the following advantages.

The heat reflection plate 123 for reflecting radiant heat from the heat stage 107 is parallel and adjacent to that surface of the hand section 117 which supports the material 105 to be heated with an intervening gap. Consequently, although the material 105 is heated to a high temperature, the radiant heat emitted from the material 105 at a high temperature is intercepted by the heat reflection plate 123, thereby reducing the amount of heat transmitted from the material 105 to the hand section 117. Hence, the hand section 117 is not subjected to the high temperature of the heated material 105, so the heat distortion of the hand section 117 can be minimized, thus maintaining the positional precision of the hand section.

Further, the heat reflection plate 123 is supported on the hand section 117 through the intermediary of the heat-insulating support means 121 with an intervening gap formed therebetween. Thus, even though the heat reflection plate 123 is thermally distorted by the radiant heat, such heat distortion is accommodated by the gap between the heat reflection plate 123 and the heat-insulating support means 121 so that it is not transferred to the hand section 117. Hence, the heat distortion of the hand section 117 can be further decreased, and accordingly, the positional precision of the hand section 117 can be further improved.

Also, since the hand section 117 is connected to the arm section 119 by the heat-insulation fitting means 151 with the heat insulation space, the heat conducted from the hand section to the arm section 119 can be decreased, thus accordingly reducing heat distortion and deformation of the arm section 119. Hence, the positional precision of the entire hand section 117 including the arm section 119 can be further improved.

Further, the seats 141 of the hand section 117 for contacting and supporting the material 105 to be heated are formed independent of the hand section 117. Consequently, even though the heat is conducted to the hand section 117 from the material 105 heated to a high temperature via the seats 141, the heat distortion of the seats 141 is not directly transferred to the hand section 117. Thus, even though the seats 141 and the hand section 117 are formed of different materials, thermal stress between the two components caused by the disparity in the heat distortion thereof is not generated. Also, the seats 141 are formed of a highly heat-resisting material because they contact the material 105 to be heated so as to be vulnerable to the high temperature, thereby improving the heat resistance of the seats 141 and decreasing the heat distortion and deformation thereof, thus maintaining the positional precision of the seats 141 of the hand section 117 for supporting the material 105 to be heated.

Still further, the provision of the cooling means 161 for cooling the heat reflection plate 123 improve the heat reflecting and intercepting function of the heat reflection plate 123 with respect to the radiant heat emitted from the heated material 105. In addition, the temperature of the heat reflection plate 123 is positively decreased by the cooling means 161, so that the heat conducted to the hand section 117 from the heat reflection plate 123 can be effectively reduced. Hence, the heat resistance of the hand section 117 can be improved and the heat distortion thereof can be decreased, thus improving the positional precision of the hand section 117.

What is claimed is:

1. A heat resisting robot hand apparatus comprising:
   a hand section having a first surface;
   a plurality of support members projecting from said first surface and having support surfaces for supporting a material to be heated spaced from said first surface; and
   a heat reflection plate for reflecting radiant heat supported by said hand section and disposed between and spaced from said first surface and said support surfaces.

2. The heat resisting robot hand apparatus according to claim 1 including heat-insulating support means supporting said heat reflection plate on said hand section with a gap accommodating heat distortion of said heat reflection plate.

3. The heat resisting robot hand apparatus according to claim 2 wherein said heat-insulating support means comprises:
   an outer collar having a low heat conductivity and an axial hole and disposed between said heat reflection plate and said first surface of said hand section;
   an inner collar having a low heat conductivity, an enlarged head, and an axial hole, said inner collar being disposed in said outer collar and extending through said heat reflection plate for clamping said heat reflection plate between said head and an end of said outer collar with an annular gap between the inner collar and the heat reflection plate and with an intervening space between said head and said heat reflection plate; and
   a fastening screw having a low heat conductivity and an enlarged head, said fastening screw extending through the axial hole in said inner collar with an annular space between said fastening screw and said inner collar and fixedly secured to said hand section.

4. The heat resisting robot hand apparatus according to claim 1 including an arm section and at least one heat-insulation fitting connecting said hand section to said arm section.

5. The heat resisting robot hand apparatus according to claim 4 wherein said heat-insulation fitting comprises:
   a collar interposed between said hand section and said arm section and having an axial hole; and
   a fastening screw having an enlarged head and extending through said axial hole in said collar with an annular space between said fastening screw and said collar and fixedly secured to said arm section.

6. The heat resisting robot hand apparatus according to claim 1 wherein each support surface is a tapered surface for contacting the material to be heated.

7. The heat resisting robot hand apparatus according to claim 1 comprising cooling means for cooling said heat reflection plate.

8. The heat resisting robot hand apparatus according to claim 7 wherein said cooling means comprises a movable cooling block for contacting said heat reflection plate.

9. The heat resisting robot hand apparatus according to claim 8 wherein said cooling means comprises a coolant circulation system for circulating a coolant through said cooling block.

10. The heat resisting robot hand apparatus according to claim 8 wherein said cooling means comprises a heat conductive member having one end connected to said cooling block and another end exposed to the ambient.

11. The heat resisting robot hand apparatus according to claim 1 wherein said heat reflection plate includes a plurality of openings through which said support members pass.

12. The heat resisting robot apparatus according to claim 11 wherein said support members pass through the openings without contacting said heat reflection plate.

13. The heat resisting robot apparatus according to claim 1 wherein said support surfaces are disposed for supporting a peripheral edge of a semiconductor wafer having a diameter, said heat reflection plate having a length at least equal to the diameter.

14. The heat resisting robot hand apparatus according to claim 4 wherein said hand section is cantilevered from said arm section.

15. The heat resisting robot hand apparatus according to claim 4 wherein said heat reflection plate overlaps said arm section.

16. The heat resisting robot hand apparatus according to claim 1 wherein said hand section has a length and said heat reflection plate extends along the entire length of said hand section.

17. The heat resisting robot hand apparatus according to claim 1 wherein said support members are separated from one another by said heat reflection plate.

18. The heat resisting robot hand apparatus according to claim 1 wherein said heat reflection plate is supported by said hand section with an air gap between said heat reflection plate and said first surface.

19. A heat resisting robot hand apparatus comprising:
   a hand section having an upper surface;
   a heat reflection plate having a thickness and disposed above and spaced from the upper surface;
   a plurality of heat-insulating supports mounted on the upper surface of the hand section, each support having a gap where the heat reflection plate is supported, the gap having a height greater than the thickness of the heat reflection plate for accommodating heat distortion of the heat reflection plate; and
   a plurality of seats extending from the hand section and each having a support surface for supporting a peripheral edge of a semiconductor wafer above and spaced from the heat reflection plate.

20. The heat resisting robot hand apparatus according to claim 19 wherein the heat reflection plate includes a plurality of openings for the seats, and the seats extend from the upper surface of the hand section and through the openings without contacting the heat reflection plate.

* * * * *